(12) United States Patent
Tapaninen et al.

(10) Patent No.: US 6,904,557 B2
(45) Date of Patent: Jun. 7, 2005

(54) DISCONTINUOUS TRANSMISSION (DTX) DETECTION USING DECODER METRIC

(75) Inventors: Jukka Tapaninen, San Diego, CA (US); Thomas Kenney, San Diego, CA (US); Jean-Marie Tran, San Diego, CA (US)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/355,324

(22) Filed: Jan. 31, 2003

(65) Prior Publication Data

US 2004/0153950 A1 Aug. 5, 2004

(51) Int. Cl.[7] .............................................. H03M 13/00
(52) U.S. Cl. ....................................................... 714/776
(58) Field of Search ................................ 714/776, 752, 714/746, 758, 786, 794–796; 370/351, 352, 332, 335; 375/147, 262, 265, 341; 455/522

(56) References Cited

U.S. PATENT DOCUMENTS

| | | | |
|---|---|---|---|
| 5,796,757 A | 8/1998 | Czaja | 714/789 |
| 6,507,927 B1 | 1/2003 | Kalliojarvi | 714/795 |
| 2003/0142728 A1 * | 7/2003 | Lin | 375/147 |

OTHER PUBLICATIONS

Wang et al., Power control methods for dedicated control channels during discontinuous transmission in IS–2000 Systems, 2000, IEEE, p. 271–275.*

Wang et al., Capacity comparison of packet options in IS–2000 with various power contorl methods, 2000, IEEE, p.1772–1777.*

"Physical Layer Standard for cdma2000 Spread Spectrum Systems, Release A"; $3^{rd}$ Generation Partnership Project 2 "3GPP2" C.S0002–A; Jun. 9, 2000.

"Physical Layer Standard for cdma2000 Spread Spectrum Systems"; $3^{rd}$ Generation Partnership Project 2"GPP2" C.S0002–O, Version 1.0; Jul. 1999.

* cited by examiner

*Primary Examiner*—Shelly A Chase
(74) *Attorney, Agent, or Firm*—Harrington & Smith, LLP; Thomas Weber

(57) ABSTRACT

A method detects an absence of a transmitted frame in a wireless communications system that operates with a discontinuous transmission (DTX) protocol between a transmitter and a receiver. The method includes decoding a received signal over a frame period to determine a cumulative metric; normalizing the cumulative metric and comparing the normalized cumulative metric to a threshold for determining whether the frame was a transmitted frame or a non-transmitted frame. The determined cumulative metric may be a maximum cumulative metric or a zero state cumulative metric. The wireless communications system may be a CDMA system, the receiver may be contained within a mobile station, and the determination of whether the frame was a transmitted frame or a non-transmitted frame can be employed, as one non-limiting example, during execution of a power control algorithm.

32 Claims, 3 Drawing Sheets

FIG. 4

$$BM_{l,k} = \sum_{i=1}^{R} S_i \, b_i^k \quad (1)$$

$$CM_k = \max_{l} (CM_l + BM_{l,k}) \quad (2)$$

$$CM_k^{tot} = \sum_{m=0}^{M-1} CM_k^m \quad (3)$$

$$CM_{max}^{tot} = \sum_{m=0}^{M-1} \max_{k} (CM_k^m) \quad (4)$$

$$p^2 \sigma^2 = \sum_{l=0}^{L-1} p_l^2 \sigma_l^2 \quad (5)$$

$$\sigma_l^2 = \frac{1}{N} \sum_{n=0}^{N-1} (p_l(n) - \overline{p}_l)^2 \quad (6)$$

$$\overline{p}_l = \frac{1}{N} \sum_{n=0}^{N-1} p_l(n) \quad (7)$$

$$\frac{\left(\frac{1}{M} \sum_{m=0}^{M-1} \max_{k} (CM_k^m)\right)^2}{\sum_{l=0}^{L-1} p_l^2 \sigma_l^2} \quad (8)$$

DISCONTINUOUS TRANSMISSION (DTX) DETECTION USING DECODER METRIC

TECHNICAL FIELD

These teachings relate generally to code division multiple access (CDMA) wireless communication systems, such as those that employ discontinuous transmission on a forward channel between a base station and a mobile station, and more generally relates to the detection of a decoded frame of data in a system that employs DTX.

BACKGROUND

In the Standard document for IS-2000-2, "Physical Layer Standard for cdma2000 Spread Spectrum Systems", release 0, July 1999, the base station is allowed to selectively disable transmission on certain forward channels on a frame by frame basis. This is referred to as discontinuous transmission, or DTX. However, information as to whether a particular frame has been transmitted or has not been transmitted is unknown to the mobile station. In the above-referenced Standard the following channels are defined as having DTX capability: Forward Dedicated Control Channel (F-DCCH), Forward Supplemental Channel 1 (F-SCH1) and the Forward Supplemental Channel 2 (F-SCH2), the latter two channels being collectively referred to herein as F-SCHn.

There are several algorithms that are executed by the mobile station that require information as to whether a frame was actually transmitted. This is referred to herein generally as a "DTX detection problem". Three examples of such algorithms are now discussed.

A first algorithm pertains to whether forward link power control is enabled on the F-DCCH or the F-SCHn. In this case the outer power control loop operates to update the current set point or operating point based on the frame error information, provided by the cyclic redundancy check (CRC) calculation. If a frame was not transmitted, then the mobile station should not update the current outer power control loop set point. In order to accomplish this the mobile station should have some capability to detect whether an actual frame transmission has occurred, or has not occurred.

A later Standard, IS-2000-2, "Physical Layer Standard for cdma2000 Spread Spectrum Systems", release A, Jun. 9, 2000, specifies a forward link power control mode on the F-DCCH (Quality Indicator Bit (QIB) power control). The algorithm also requires detection of the F-DCCH frame transmission.

The IS-2000-2, "Physical Layer Standard for cdma2000 Spread Spectrum Systems", release A, Jun. 9, 2000 Standard also allows a power control subchannel on the forward link to be transmitted on the Forward Fundamental Channel (F-FCH) or on the F-DCCH based on a parameter FPC_PRI_CHAN. When the power control subchannel is transmitted on the F-DCCH, a mobile station supervision procedure algorithm requires DTX detection.

As should be appreciated, it is important that the mobile station operating under the above-described conditions be capable of determining whether DTX was in effect on a frame-by-frame basis in order to ensure proper functionality. Prior to this invention this important need was not satisfied, and the DTX detection problem was not resolved.

SUMMARY OF THE PREFERRED EMBODIMENTS

The foregoing and other problems are overcome, and other advantages are realized, in accordance with the presently preferred embodiments of these teachings.

This invention provides a method and a system for determining DTX status based on a decoder metric, and solves the DTX detection problem.

For a presently preferred, but non-limiting, embodiment where a channel uses convolutional coding, the cumulative metric (CM) of a Viterbi decoder is used. Specifically, the value of the CM at the end of a frame is used. However, the value of the CM is found to be proportional to the symbol amplitude, and is also sensitive to the pilot channel and noise powers, which makes it difficult to derive an optimal threshold for frame classification. It is thus preferred to use the quantity $(CM)^2/(p^2\delta^2)$, where $p^2$ and $\delta^2$ are pilot power and noise variance, respectively, which has the desired attribute of being independent of the pilot and noise powers. The quantity $(CM)^2/(p^2\delta^2)$ may be referred to as a normalized cumulative metric.

A DTX detection algorithm based on the CM, and more specifically on the normalized CM is as follows. First, a signal to noise ratio (SNR) estimation algorithm is executed to estimate the pilot and noise powers averaged over the frame. Second, a calculation is made of the normalized CM based on the expression $(CM)^2/(p^2\delta^2)$. If the normalized cumulative metric is greater than a predetermined threshold, the frame is declared to be a transmitted frame, otherwise frame is declared to be one that is not transmitted, i.e., a DTX frame. The resulting information is then used by the mobile station data processor during the execution of various mobile station algorithms, including power control-related algorithms.

A method is disclosed for detecting an absence of a transmitted frame in a wireless communications system that operates with a discontinuous transmission protocol between a transmitter and a receiver, as is a wireless communications system that operates in accordance with the method. The method includes decoding a received signal over a frame period to determine a cumulative metric; normalizing the cumulative metric and comparing the normalized cumulative metric to a threshold for determining whether the frame was a transmitted frame or a non-transmitted frame. The determined cumulative metric may be a maximum cumulative metric or a zero state cumulative metric.

The normalizing operation includes squaring the determined cumulative metric, and dividing the squared determined cumulative metric by an estimated pilot power and noise variance.

In a preferred embodiment the wireless communications system is a code division, multiple access system, and the received signal is received from one of a Forward Dedicated Control Channel (F-DCCH), a Forward Supplemental Channel 1 (F-SCH1), or a Forward Supplemental Channel 2 (F-SCH2). In the preferred embodiment the receiver is contained within a mobile station, and the determination of whether the frame was a transmitted frame or a non-transmitted frame is employed during execution of at least one algorithm by the mobile station. The at least one algorithm may be a power control-related algorithm, or a supervision-related algorithm, as two non-limiting examples of algorithms that may benefit from the use of the DTX detection information made possible by this invention.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein:

FIG. 4 shows several equations that are referenced during the detailed description of the invention.

DETAILED DESCRIPTION OF THE PREFERRED EMBODIMENTS

Figure 1:
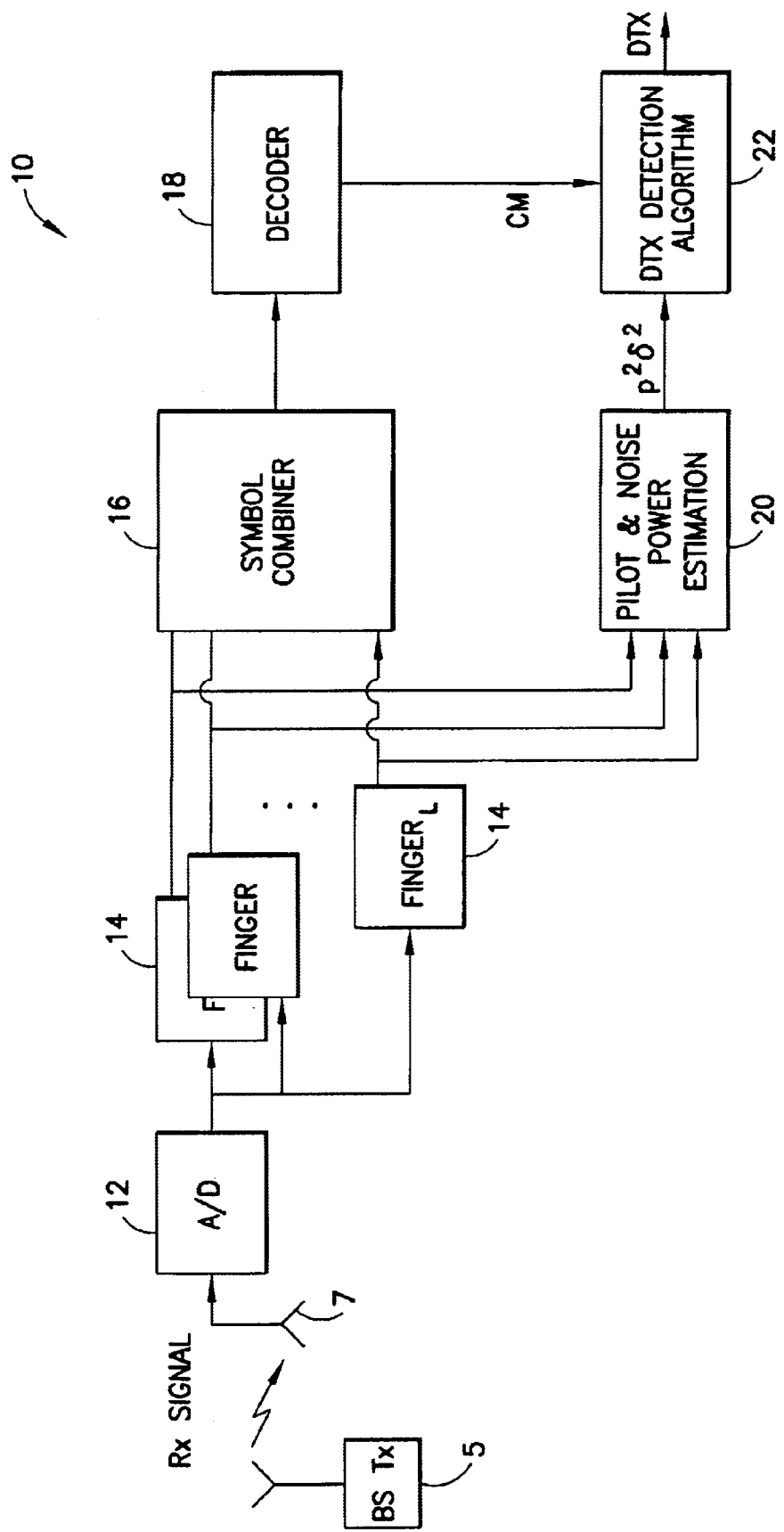
FIG. 1 is a block diagram of a CDMA receiver that includes a DTX detection block in accordance with an aspect of this invention.

Reference is made to FIG. 1 for illustrating a block diagram of a CDMA receiver 10, which is assumed for convenience, but not by way of necessity, to be contained within a mobile station, such as a cellular telephone or a personal communicator. The receiver 10 assumes the presence of a base station transmitter 5, and an antenna 7 through which the base station transmission is received. An analog received signal (RX) is sampled by an analog to digital (A/D) converter 12, and the resulting digital representation of the received signal is processed in multiple correlator blocks, typically referred to as fingers 14. The correlator results are combined by a symbol combiner 16 having an output that feeds a data decoder block 18, which may operate as a Viterbi decoder. The output of each finger 14 is also processed in a pilot and noise power estimation block 20. The combined pilot and noise variance estimate, averaged over a frame, together with the CM information output from the decoder 18, are provided as inputs to a DTX detection algorithm block 22 that operates in accordance with this invention.

Figure 2:
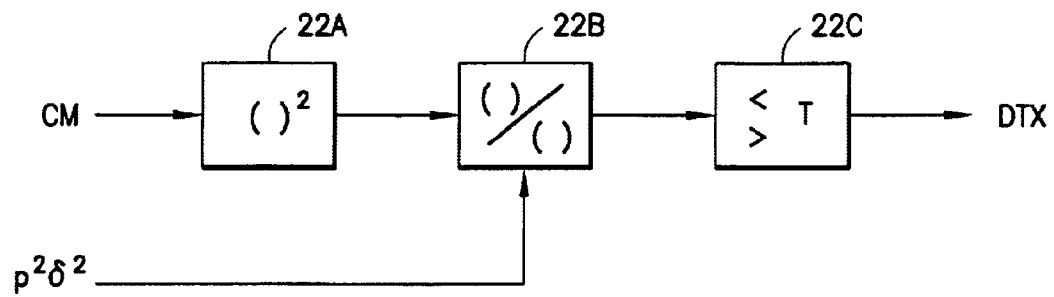
FIG. 2 shows the construction of the DTX detection block, that implements a DTX detection algorithm in accordance with this invention.

FIG. 2 shows a block diagram of the DTX detection algorithm that is executed by the DTX detection algorithm block 22. The cumulative metric output from the decoder 18 is squared in block 22A and is then divided in block 22B by the combined noise and pilot power estimate output from the power estimation block 20. The result is compared to a predetermined threshold in block 22C, and the DTX status is derived therefrom.

Reference with regard to decoders, such as Viterbi decoders, can be made, as examples, to commonly assigned U.S. Pat. No. 5,796,757, "Methods and Apparatus for Performing Rate Determination with a Variable Rate Viterbi Decoder", S. Czaja, and to commonly assigned U.S. Pat. No. 6,507,927, "Method and Device for Estimating the Reliability of a Decoded Symbol Sequence", K. Kalliojarvi.

What follows now is a more detailed description of the operation of the receiver 10, and more particularly a description of the operation of the DTX detection algorithm block 22, and a description of the cumulative metric calculation performed by the decoder 18.

Soft data symbol S is used in the Viterbi decoder 18 for the CM calculation. At every time step in a decoder trellis, and for each node of the trellis, the branch metric (BM) is calculated by the inner product of R received symbols, for a 1/R rate code, and the transition sign vector (b) that is pre-calculated based on the transmitter data encoder structure, in accordance with Equation (1) in FIG. 4, where k denotes the current node index (k=0 . . . $2^{(K-1)}$–1, K constraint length) and l is the node index from which node the transition to node k takes place.

Figure 3:
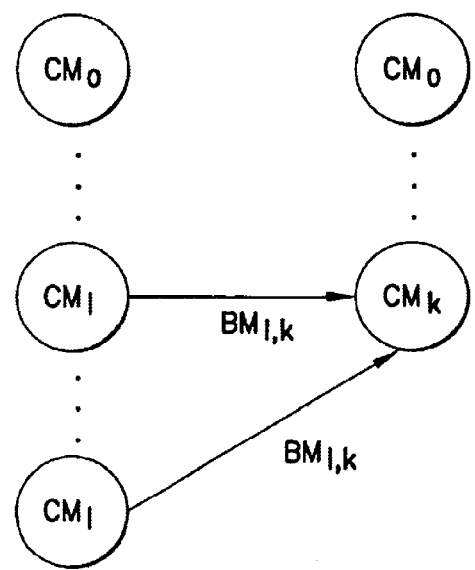
FIG. 3 is a graph illustrating decoder state transitions from a node 1 to a node k.

Referring also to FIG. 3, for each node k of the decoder 18 trellis there are two possibilities as from which of the two nodes l a transition may have originated from. To determine the most probable origination node of the transition the branch metric ($BM_{1,k}$) is added to the CM of node 1 ($CM_1$), and the result having the maximum value is selected as the new cumulative metric of node k, in accordance with Equation (2) of FIG. 4.

The total cumulative metric of node k ($CM_k$) is defined as an integral of the cumulative metric of node k over the frame in accordance with Equation (3) in FIG. 4, where the index m refers to the bit index of the frame of length of M bits.

The maximum total cumulative metric is defined by selecting the maximum state cumulative metric at each step m, and by integrating the maximum state metric over the frame in accordance with Equation (4) in FIG. 4.

Also, it is typically the case that the convolutional encoder shift register (not shown) at the base station transmitter 5 is flushed by inserting (K-1) zeros at the end of a frame. Consequently, the terminal node at the end of the frame decoding is then also, with high probability, the node zero. Assuming this is the case, one can readily observe that the cumulative metric of node zero equals the maximum total cumulative metric.

This invention is not thus restricted for the selection of the cumulative metric used for the DTX detection algorithm block 22. That is, the maximum cumulative metric shown in Equation (3), or the zero state cumulative metric of Equation (4), can be used as the input to the DTX detection algorithm block 22. The form shown in Equation (8), and discussed below, may also be used, and may be presently preferred for use. In any case, it is preferred to normalize the value of the CM at the end of a frame. This is true because the value of the CM can be shown to be proportional to the symbol amplitude, and to also be sensitive to the pilot channel and noise powers. This variability makes it difficult to derive an optimal threshold for frame classification. It is thus preferred to use the quantity $(CM)^2/(p^2\delta^2)$, where $p^2$ and $\delta^2$ are the pilot power and noise variance, respectively, for the case of one finger 14. The resulting normalized quantity $(CM)^2/(p^2\delta^2)$ thus has the desired attribute of being independent of the pilot and noise powers. The quantity $(CM)^2/(p^2\delta^2)$ maybe referred to as a normalized cumulative metric.

The mobile station employs a signal to noise ratio (SNR) estimation algorithm executed by power estimation block 20 to estimate the pilot and noise powers averaged over the frame. In the presently preferred embodiment of this invention a multi-finger form of $p^2$ and $\delta^2$ can be employed, where the values of these quantities can be determined by the pilot and noise power estimation block 20 as described in further detail below.

As was discussed above, the normalized cumulative metric $(CM)^2/(p^2\delta^2)$ has the cumulative metric normalized by the product of the combined pilot and noise powers. In case of a typical CDMA receiver employing multiple fingers 14 the product of the combined pilot and noise power is calculated as shown in Equation (5) of FIG. 4, where $p_1^2$ and $\delta_1^2$ are the pilot power and the noise variance of finger 1, respectively. L denotes the total number of fingers. The estimation of the noise variance can be performed in various ways. A typical and suitable technique is to estimate the mean and variance over a period of N symbols, as shown in Equation (6), where the mean of the pilot is shown in Equation (7) of FIG. 4.

A normalized cumulative metric that is independent of the frame length and channel conditions is obtained as shown in Equation (8) of FIG. 4, where the maximum metric (shown in Equation (4)) is selected for use. As was discussed above, this invention is not restricted to only the use of the maximum cumulative metric.

Equation (8) of FIG. 4 presents the general form of $(CM)^2/(p^2\delta^2)$, extended to a multiple finger case. It should be noted that the cumulative metric shown in Equation (4) is normalized by the frame length M in Equation (8). It can be shown that the normalized quantity shown in Equation (8) is independent of the frame length and channel conditions, such as noise and interference. As such, the use of a single threshold value is generally sufficient in block 22C for the determination of the DTX frame. In practice, the value of the threshold is implementation specific and does not lend itself to a theoretical derivation. Simulation and/or laboratory and field testing is thus a preferred technique to derive the optimal threshold value.

Still discussing FIGS. 2 and 3, the DTX detection algorithm block 22 calculates the normalized CM based on the expression, for example $(CM)^2/(p^2\delta^2)$, or the CM value shown in Equation (8), in blocks 22A and 22B of FIG. 2. If the normalized CM is found to be greater than the threshold by the comparison block 22C, the frame is declared to be a transmitted frame. If the normalized CM is found to be not greater than the threshold by the comparison block 22C, the frame is declared to be one that is not transmitted, i.e., a DTX frame. The resulting information is then used by the mobile station data processor during the execution of various mobile station algorithms, including power control-related algorithms.

As was noted above with regard to the threshold, a suitable value may be best determined empirically and/or by simulation. It should be noted, however, that the threshold value need not be defined as a constant, but instead can be defined as a variable that is a function of at least the value of M, i.e., the length of the frame in bits. For the case of the IS-2000-2 Standard that is of particular interest to this invention, the frame length can vary and is not fixed. Thus, a reference herein to a "predetermined" threshold value need not imply that the threshold value is a constant, but only that the threshold value has been predetermined prior to use. Note, however, that if the normalized CM form shown in Equation (8) is used, i.e., one also normalized by the frame length, then a single threshold value may suffice.

In a preferred embodiment the channel decoder 18 is implemented in hardware, and the normalization of the decoder metric CM using the pilot power and noise estimates, and the comparison to the threshold, all executed by the DTX detection algorithm block 22, can be readily implemented in software executed by a mobile station data processor.

While described in the context of presently preferred embodiments of this invention, those skilled in the art should appreciate that various modifications can be made to these preferred embodiments, and that all such modifications will fall within the scope of this invention. For example, while described in the context of a CDMA system where the determination whether the frame was a transmitted frame or a non-transmitted frame is subsequently employed during execution of a power control algorithm in the mobile station, the execution of other types of algorithms may benefit from this information as well, such as, but not limited to, a supervision-related algorithm. Also, other techniques for computing cumulative metrics may be employed, as can other techniques for performing the pilot power and noise variance estimations.

What is claimed is:

1. A method for detecting an absence of a transmitted frame in a wireless communications system that operates with a discontinuous transmission protocol between a transmitter and a receiver, comprising:

decoding a received signal over a frame period to determine a cumulative metric;

normalizing the cumulative metric; and comparing the normalized cumulative metric to a threshold for determining whether the frame was a transmitted frame or a non-transmitted frame.

2. A method as in claim 1, where the determined cumulative metric comprises a maximum cumulative metric.

3. A method as in claim 1, where the determined cumulative metric comprises a zero state cumulative metric.

4. A method as in claim 1, where the wireless communications system comprises a code division, multiple access system.

5. A method as in claim 4, where the received signal is received from a Forward Dedicated Control Channel (F-DCCH).

6. A method as in claim 4, where the received signal is received from a Forward Supplemental Channel 1 (F-SCH 1).

7. A method as in claim 4, where the received signal is received from a Forward Supplemental Channel 2 (F-SCH2).

8. A method as in claim 4, where the receiver comprises a part of a mobile station, and where the determination of whether the frame was a transmitted frame or a non-transmitted frame is employed during execution of a power control algorithm.

9. A method for detecting an absence of a transmitted frame in a wireless communications system that operates with a discontinuous transmission protocol between a transmitter and a receiver, comprising:

decoding a received signal over a frame period to determine a cumulative metric;

normalizing the cumulative metric; and comparing the normalized cumulative metric to a threshold for determining whether the frame was a transmitted frame or a non-transmitted frame, where normalizing comprises squaring the determined cumulative metric, and dividing the squared determined cumulative metric by an estimated pilot power and noise variance.

10. A method for detecting an absence of a transmitted frame in a wireless communications system that operates with a discontinuous transmission protocol between a transmitter and a receiver, comprising:

decoding a received signal over a frame period to determine a cumulative metric;

normalizing the cumulative metric; and comparing the normalized cumulative metric to a threshold for determining whether the frame was a transmitted frame or a non-transmitted frame, where normalizing also comprises dividing by the frame length.

11. A wireless communications system that operates with a discontinuous transmission protocol between a transmitter and a receiver, comprising:

a decoder for decoding a received signal over a frame period to obtain a cumulative metric;

a normalizer for normalizing the cumulative metric; and a comparator for comparing the normalized cumulative metric to a threshold for determining whether the frame was a transmitted frame or a non-transmitted frame.

12. A wireless communications system as in claim 11, where the decoder outputs a maximum cumulative metric.

13. A wireless communications system as in claim 11, where the decoder outputs a zero state cumulative metric.

14. A wireless communications system as in claim 11, where the wireless communications system comprises a code division, multiple access system.

15. A wireless communications system as in claim 14, where the received signal is received from a Forward Dedicated Control Channel (F-DCCH).

16. A wireless communications system as in claim 14, where the received signal is received from a Forward Supplemental Channel 1 (F-SCH1).

17. A wireless communications system as in claim 14, where the received signal is received from a Forward Supplemental Channel 2 (F-SCH2).

18. A wireless communications system as in claim 14, where the receiver comprises a part of a mobile station, and where the determination of whether the frame was a transmitted frame or non-transmitted frame is employed during execution of a power control algorithm.

19. A wireless communications system that operates with a discontinuous transmission protocol between a transmitter and a receiver, comprising:

a decoder for decoding a received signal over a frame period to obtain a cumulative metric;

a normalizer for normalizing the cumulative metric; and a comparator for comparing the normalized cumulative metric to a threshold for determining whether the frame was a transmitted frame or a non-transmitted frame, where the normalizer comprises means for squaring the determined cumulative metric, and means for dividing the squared determined cumulative metric by an estimated pilot power and noise variance.

20. A wireless communications system that operates with a discontinuous transmission protocol between a transmitter and a receiver, comprising:

a decoder for decoding a received signal over a frame period to obtain a cumulative metric;

a normalizer for normalizing the cumulative metric; and a comparator for comparing the normalized cumulative metric to a threshold for determining whether the frame was a transmitted frame or a non-transmitted frame, where the normalizer further comprises means for dividing by the frame length.

21. A method for detecting an absence of a transmitted frame in a wireless code division, multiple access communications system that operates with a discontinuous transmission (DTX) protocol between a base station transmitter and a mobile station receiver, comprising:

decoding a signal received from a convolutional channel over a frame period to determine a cumulative metric;

normalizing the cumulative metric, comprising squaring the determined cumulative metric, and dividing the squared determined cumulative metric by an estimated pilot power and noise variance; and comparing the normalized cumulative metric to a threshold for determining whether the frame was a DTX frame or a non-DTX frame.

22. A method as in claim 21, where the determined cumulative metric comprises one of a maximum cumulative metric and a zero state cumulative metric.

23. A method as in claim 21, where the received signal is received from one of a Forward Dedicated Control Channel (F-DCCH), a Forward Supplemental Channel 1 (F-SCH1) and a Forward Supplemental Channel 2 (F-SCH2).

24. A method as in claim 21, where the determination of whether the frame was a DTX frame or a non-DTX frame is employed during execution of at least one mobile station power control algorithm.

25. A method as in claim 21, where normalizing further comprises dividing the determined cumulative metric by the frame length prior to squaring.

26. A method as in claim 25, where dividing the squared determined cumulative metric comprises dividing by a multi-finger form of the estimated pilot power and noise variance.

27. A receiver for use in a wireless code division, multiple access communications system that operates with a discontinuous transmission (DTX) protocol between a transmitter and the receiver, comprising:

a decoder to decode a signal received from a channel during a frame period to determine a cumulative metric;

a normalizer coupled to an output of the decoder to normalize the cumulative metric by operations that comprise squaring the determined cumulative metric, and dividing the squared determined cumulative metric by an estimated pilot power and noise variance; and a comparator coupled to an output of the normalizer to compares the normalized cumulative metric to a threshold so as to determine whether a received frame was a DTX frame or a non-DTX frame.

28. A receiver as in claim 27, where the determined cumulative metric comprises one of a maximum cumulative metric and a zero state cumulative metric.

29. A receiver as in claim 27, where the signal is received from one of a Forward Dedicated Control Channel (F-DCCH), a Forward Supplemental Channel 1 (F-SCH1) and a Forward Supplemental Channel 2 (F-SCH2).

30. A receiver as in claim 27, where the determination of whether the frame was a DTX frame or a non-DTX frame is considered during execution of a power control algorithm.

31. A receiver as in claim 27, where said normalizer comprises a divider to divide the determined cumulative metric by a length of the frame prior to squaring.

32. A receiver as in claim 31, where the divider further divides by a multi-finger form of the estimated pilot power and noise variance.

* * * * *